United States Patent
Ha et al.

(10) Patent No.: US 6,228,739 B1
(45) Date of Patent: May 8, 2001

(54) PRE-TREATMENT METHOD PERFORMED ON A SEMICONDUCTOR STRUCTURE BEFORE FORMING HEMI-SPHERICAL GRAINS OF CAPACITOR STORAGE NODE

(75) Inventors: Heon-jae Ha, Seoul; Hong-seong Son, Kyungki-do; Young-ki Hong, Kyungki-do; Jae-inh Song, Kyungki-do; Chun-yong Park, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/306,917

(22) Filed: May 7, 1999

(30) Foreign Application Priority Data

May 15, 1998 (KR) .................................. 98-17569
Dec. 15, 1998 (KR) .................................. 98-55041

(51) Int. Cl.[7] .................................................. H01L 21/20
(52) U.S. Cl. ........................ 438/398; 438/664; 438/665
(58) Field of Search ................... 438/255, 398, 438/488, 665, 719, 964

(56) References Cited

U.S. PATENT DOCUMENTS 5,539,256 * 7/1996 Mikagi .................................. 257/763

* cited by examiner

Primary Examiner—David Nelms
Assistant Examiner—Dung A Le
(74) Attorney, Agent, or Firm—Jones Volentine, LLC

(57) ABSTRACT

A pre-treatment method for improving the growth of hemi-spherical grains (HSGs) on a semiconductor structure by removing etching residue before forming a capacitor storage node having the HSGs. The pre-treatment method includes dry-etching a material layer formed on a surface of a semiconductor substrate to form a storage node pattern on the semiconductor substrate. Multiple ashing sequences are then performed on the semiconductor structure using an etching gas, followed by a stripping step using $H_2SO_4$ to remove any residue remaining on the semiconductor structure after the multiple ashing sequences. The semiconductor structure is then cleaned with an ammonium peroxide mixture (APM), and HSGs are thereafter grown on capacitor storage nodes of the storage node pattern.

18 Claims, 4 Drawing Sheets

PRE-TREATMENT METHOD PERFORMED ON A SEMICONDUCTOR STRUCTURE BEFORE FORMING HEMI-SPHERICAL GRAINS OF CAPACITOR STORAGE NODE

BACKGROUND OF THE INVENTION

1. Field of the Invention

The present invention relates to a method for fabricating a semiconductor integrated circuit, and more particularly, to a pre-treatment method performed on a semiconductor structure before forming hemi-spherical grains (HSGs) on a storage node of a capacitor for a semiconductor integrated circuit.

2. Description of the Related Art

As the techniques for fabricating semiconductor devices become more advanced, memory devices having larger capacities can be produced to meet demand in the ever increasing areas in which semiconductor devices are applied. As the memory circuit becomes more highly integrated with increases in the capacity of the memory of the device, the area of a unit memory cell of the device becomes smaller and the cell capacitance is reduced. For instance, a dynamic random access memory (DRAM) includes a capacitor used as a means of storing information, and a controllable switching transistor for transmitting signals, connected to the capacitor. In such a DRAM, the area of the unit memory cell is so small that the correspondingly low capacitance makes the memory cell difficult to read, and is a significant cause of soft errors.

In the memory cell, the base structure of a capacitor includes a storage electrode, a dielectric layer and a plate electrode. In this case, there are three ways to obtain high capacitance in a small area: a reduction in the thickness of the dielectric layer, an increase in the effective area of the capacitor electrode, and the use of a material having a high dielectric constant as the dielectric layer. However, the thickness of the dielectric layer impacts the performance of the dielectric layer. That is, as the thickness is reduced, the leakage current of the capacitor is increased and the dielectric breakdown voltage is decreased. Thus, the dielectric layer should be thick enough to prevent the leakage current and to sustain a sufficient dielectric breakdown voltage. The effective area of the capacitor electrode depends on the shape of various types of capacitors (e.g., planar, trench, stack, cylinder types) that are used. For higher dielectric constants, the leakage current is less, the dielectric breakdown voltage is high, and the thickness of the layer and the size of the memory cell can be reduced and the capacitance is increased.

Instead of using capacitors having three-dimensional structures, such as trench or cylinder types of capacitors, to increase capacitance, many of today's 16–256 DRAM devices rely upon hemi-spherical grains (HSGs) which are grown on the surface of the storage node. The method for growing HSGs on the surface of the storage node to increase the capacitance involves a process of phase-changing amorphous silicon to polysilicon. Specifically, the amorphous silicon is first deposited on a semiconductor substrate. When the semiconductor substrate where the amorphous silicon is deposited is then annealed, the amorphous silicon grows and changes into polysilicon having a rough surface where fine hemi-spherical grains are present. In the capacitor storage node of the HSG type, the surface area is two or three times larger than that of a conventional flat surface of the same size.

FIG. 1 is a cross-sectional view illustrating a conventional pre-treatment method before forming the HSGs of the storage node.

Referring to FIG. 1, sub-structures (not shown) such as a transistor and a bit line are formed on a semiconductor substrate 10, and an interlayer dielectric film 20 for forming a capacitor is formed thereon. Photolithography and etching processes are then performed on the interlayer dielectric film 20 to form a contact hole exposing a part of the semiconductor substrate 10. Thereafter, a plug 30 is formed to fill the contact hole. Then, a storage node layer of polysilicon is deposited and patterned to form a storage node pattern 50. Any etching residue remaining after the patterning process is removed through ashing, using oxygen gas as an etching gas, and a stripping process using $H_2SO_4$. A cleaning process for removing native oxide growing on the surface of the storage node pattern 50 is performed using a cleaning solution including fluoric acid (HF). After this conventional pre-treatment method is completed, amorphous silicon is deposited on the resulting structure and grown to form HSGs (see FIG. 2).

However, even after performing the cleaning process using HF in an attempt to remove the native oxide on the storage node pattern 50, an etching residue layer 40 including polymers or particles formed by plasma damage, and remnants of the native oxide layer, still remain on the surface of the storage node pattern 50.

FIG. 2 is a scanning electronic microscope (SEM) photograph illustrating a case where HSGs are formed by depositing amorphous silicon and annealing the same without the etching residue layer 40 (FIG. 1) being removed properly. The etching residue layer 40 prevents a silicon (Si) component from moving around an amorphous silicon seed in the subsequently performed process of growing HSGs. Thus, if the growth of the HSGs is suppressed, the surface area of the storage node pattern 50 fails to increase the effective area of the capacitor electrode. The resultant semiconductor memory device will thus fail to possess the desired high level of capacitance.

SUMMARY OF THE INVENTION

It is an objective of the present invention to provide a pre-treatment method which includes cleaning a storage node pattern before forming HSGs of a capacitor storage node. The pre-treatment method effectively removes polymers remaining on the surface of the storage node pattern and etching residue caused by plasma damage. This is achieved by performing the ashing process in multiple stages using an etching gas capable of removing a native oxide remaining after etching a capacitor storage node pattern, performing a $H_2SO_4$ stripping step, and performing a cleaning step using an ammonium peroxide mixture (APM).

Accordingly, to achieve the above and other objectives, there is provided a pre-treatment method performed on a semiconductor structure before HSGs are grown, where the pre-treatment method includes dry-etching a material layer formed on a surface of a semiconductor substrate, with the material layer having a photoresist pattern formed thereon. The dry-etching forms a resultant semiconductor structure comprising a storage node pattern on the semiconductor substrate. Multiple ashing sequences are then performed on the semiconductor structure using an etching gas. The semiconductor structure is stripped using $H_2SO_4$ to remove any residue remaining on the semiconductor structure after the multiple ashing sequences. The semiconductor structure is then cleaned with an ammonium peroxide mixture (APM), after which, the HSGs are grown on storage nodes of the storage node pattern.

According to a preferred embodiment of the present invention, the etching gas includes $O_2$ combined with one of $CF_4$ and $N_2$, depending on the type of material to be removed, with the multiple ashing sequences being performed in situ, that is, in batch type ashing equipment.

Preferably, the multiple ashing sequences are performed in three sub-steps including (1) removing polymers at the sidewalls of the dry-etched storage node pattern, (2) removing the photoresist pattern, and (3) removing both a native oxide layer and a layer produced due to etching damage on the surface of the storage node.

In the ashing sequence of step (1), a gas containing $O_2$ and $CF_4$ mixed in a ratio of about 100 to 2.5 is used as an etching gas, with the ashing sequence of step (1) being performed for about 30 seconds at a chamber pressure of 0.8–1.2 Torr, a temperature of 240–260° C. and a power of 920–980 W.

In the ashing sequence of step (2), a gas containing $O_2$ and $H_2$ mixed in a ratio of about 100 to 5 is used as an etching gas, with the ashing sequence of step (2) being performed for about 30–50 seconds at a chamber pressure of 0.9–1.3 Torr, a temperature of 240–260° C. and a power of 870–930 W.

In the ashing sequence of step (3), a gas containing $O_2$ and $CF_4$ mixed in a ratio of about 100 to 1.5 is used as an etching gas, with the ashing sequence of step (3) being performed for about 10–30 seconds at a chamber pressure of 0.9–1.3 Torr, a temperature of 240–260° C. and a power of 870–930 W.

The APM cleaning process comprises cleaning the semiconductor substrate with a solution selected from the group consisting of $NH_4OH+H_2O_2$+deionized water, $NH_4OH+H_2O_2$, $NH_4F+HF+H_2O_2$+deionized water, $CH_3COOH+HNO_3+HF$+deionized water, and $NH_4OH$+deionized water. The APM cleaning process is preferably performed for a designated time period sufficient to remove about 100–500 Å of material from the surface of the storage node pattern, which is on the order of about 20–40 minutes. The APM cleaning is preferably performed once continuously for the designated time period, but it may be performed in two or more stages that equal the designated time period.

Also, after the APM cleaning process, an additional cleaning step may be performed on the semiconductor structure for about 5–15 minutes with the same cleaning solution.

Therefore, according to the present invention, before forming HSGs of a capacitor storage node, polymers remaining on the surface of the capacitor storage node pattern and etching residue due to plasma damage can be effectively removed, to thereby foster the growth of the HSGs and produce a capacitor with an increased capacitance.

BRIEF DESCRIPTION OF THE DRAWINGS

The above and other objectives and advantages of the present invention will become more apparent by describing in detail preferred embodiments thereof with reference to the attached drawings in which.

DESCRIPTION OF THE PREFERRED EMBODIMENT

Hereinafter, a preferred embodiment of the present invention will be described in detail with reference to the accompanying drawings.

Figure 3:
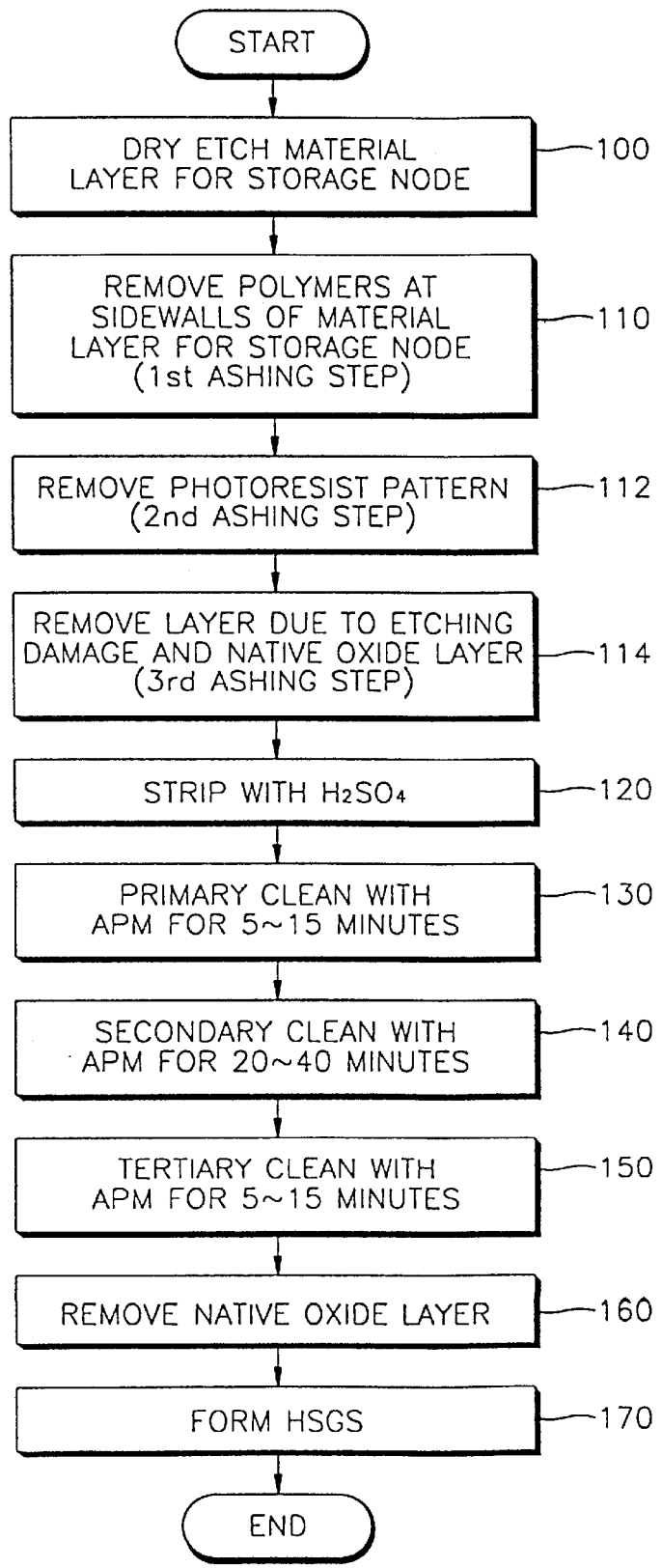
FIG. 3 is a flowchart illustrating a pre-treatment method performed on a semiconductor structure before forming HSGs of a capacitor storage node, according to the present invention.

FIG. 3 is a flowchart illustrating a pre-treatment method performed on a semiconductor structure before forming HSGs of a capacitor storage node. The semiconductor structure, which contains a typical sub-structure such as transistors and bit lines, is covered by polysilicon, which is a material layer for a capacitor storage node. Referring to FIG. 3, this material layer is patterned using a photoresist, and is then dry-etched to form a storage node pattern (step 100).

The photoresist pattern used in the dry-etching process and other residue is then removed by ashing (steps 110, 112, 114). Generally, in the conventional art, only an $O_2$ plasma is used in the ashing process, but in the present invention the etching gas also contains $CF_4$, which is a gas capable of removing a native oxide layer. Also, rather than performing ashing just once in ashing equipment having a single-wafer type chamber, as with the conventional art, in the present invention ashing is performed in multiple stages in ashing equipment having a batch type chamber, that is, in-situ. A shortcoming of the $O_2$ plasma, single step photoresist pattern ashing process of the conventional art is that polymers, a layer damaged by etching, and a native oxide layer all still remain on the surface of the polysilicon material layer for the storage node, which impedes the growth of HSGs on the storage node in a subsequent process. However, in the present invention, to overcome this shortcoming, the ashing process combines $O_2$ plasma and an etching gas containing $CF_4$, and the ashing is performed in multiple stages, e.g., in three steps. Specifically, in the first ashing step (step 110), polymers along the sidewalls of the dry-etched storage node pattern are mainly removed; in the second ashing step (step 112), the photoresist pattern is mainly removed; and in the third ashing step (step 114), the native oxide layer and the layer produced due to etching damage on the surface of the storage node pattern are mainly removed.

For the first ashing step (step 110), the processing conditions in the batch type chamber are a pressure of 0.8–1.2 Torr (preferably 1.0 Torr), a temperature of 240–260° C. (preferably 250° C.), and a power of 920–980 W (preferably 950 W). The polymers are ashed using an etching gas in which $O_2$ and $CF_4$ are mixed in a ratio of about 100 to 2.5 such that the etching rate of photoresist is 14020 Å/min and that of an oxide layer is 70 Å/min. The duration of the first ashing step (step 110) is approximately 20–40 seconds, preferably about 30 seconds.

For the second ashing step (step 112), the processing conditions in the batch type chamber are a pressure of 0.9–1.3 Torr (preferably 1.1 Torr), a temperature of 240–260° C. (preferably 250° C.), and a power of 870–930

W (preferably 900 W). The photoresist is ashed using an etching gas in which $O_2$ and $H_2$ are mixed in a ratio of about 100 to 4 such that the etching rate of photoresist is 55000 Å/min. The duration of the second ashing step (step 112) is approximately 30–50 seconds, preferably about 40 seconds.

For the third ashing step (step 114), the processing conditions in the batch type chamber are a pressure of 0.9–1.3 Torr (preferably 1.1 Torr), a temperature of 240–260° C. (preferably 250° C.), and a power of 870–930 W (preferably 900 W). The native oxide layer and the layer produced due to etching damage are ashed using an etching gas in which $O_2$ and $CF_4$ are mixed in a ratio of about 100 to 1.5 such that the etching rate of photoresist is 14020 Å/min and that of an oxide layer is 100 Å/min. The duration of the third ashing step (step 114) is approximately 10–30 seconds, preferably about 20 seconds.

If the polymers on the surface of the storage node pattern, the layer produced due to etching damage, and the native oxide layer are removed as described above, the capacitance can be increased by fostering growth of HSGs in a subsequent process. The increased HSG growth is indirectly verified by measuring their contact angle with regard to the storage node pattern or through surface analysis using X-ray photoelectron spectroscopy (XPS).

The contact angle is used as a means for checking whether the surface of a wafer is hydrophilic or hydrophobic. In general, a hydrophobic wafer surface exhibits an increased contact angle and vice versa. For example, a native oxide layer is a typical hydrophilic layer with a small contact angle. The contact angle of a silicon layer surface is generally about 65 degrees.

In order to confirm the effects of the inventive ashing process described herein, the ashing process was performed on a first sample in three steps using an etching gas containing $CF_4$ as in the present invention, followed by a cleaning process using a HF solution for 90 seconds, and then the contact angle was measured. On a second sample, the ashing process was performed using only $O_2$ gas as in the conventional art, followed by a cleaning process using a HF solution for 90 seconds, and then the contact angle was measured. The contact angle of the first sample was 63 degrees and that of the second sample was 45 degrees, which confirms that a superior effect of removing the native oxide layer was exhibited on the surface of the storage node pattern for the first sample according to the present invention.

Next, a surface analysis using XPS was performed. The results, showing the states of certain elements on the surface of a storage node material layer, are shown in the following Table 1. In Table 1, the third sample was not ashed; the second sample was ashed using only the $O_2$ gas as an etching gas and a single ashing step as in the conventional art; and the first sample was ashed using the $O_2$ and $CF_4$ gases as an etching gas, as well as the multiple ashing sequences as in the present invention.

TABLE 1

Surface Analysis Using XPS (Unit: Atomic %)

| Component | Silicon (Si) | Oxygen (O) | Fluorine (F) |
|---|---|---|---|
| Sample #3 | 47 | 44.6 | 1.6 |
| Sample #2 | 54.6 | 35.9 | 0.3 |
| Sample #1 | 57.4 | 33.2 | — |

As shown in Table 1, the oxide layer with the least amount of oxygen component was detected on the surface of the storage node material layer for the first sample, which used the multiple ashing steps of the present invention. Moreover, for the first sample, materials containing fluorine, such as polymers or the layer produced due to etching damage, were scarcely detected.

Returning to the flowchart of FIG. 3, after the ashing steps, any etching residue which was not removed by the ashing is removed by performing a $H_2SO_4$ stripping process (step 120). After the $H_2SO_4$ stripping process, the semiconductor structure was primarily cleaned by an ammonium peroxide mixture (APM) for about 5–15 minutes (step 130). Here, the APM cleaning solution is preferably one solution mixture selected from the group consisting of $NH_4OH$+$H_2O_2$+deionized water, $NH_4OH$+$H_2O_2$, $NH_4F$+HF+$H_2O_2$+deionized water, $CH_3COOH$+$HNO_3$+HF+deionized water and $NH_4OH$+deionized water. For example, the solution can be a mixture of $NH_4OH$+$H_2O_2$+deionized water in a ratio of 1:4:20. The effect of cleaning using APM according to the present invention is shown in Table 2.

TABLE 2

APM Cleaning Efficiency

| APM Cleaning Conditions | Etching rate (Å/min) |
|---|---|
| Sample APM-cleaned for 10 minutes | 17 |
| Sample APM-cleaned for 20 minutes | 22 |
| Sample APM-cleaned for 30 minutes | 29 |
| Sample APM-cleaned for 40 minutes | 33 |

In Table 2, the etching rates of samples which were APM-cleaned for 10–40 minutes and wet-etched are shown. As the results show, when APM cleaning is repeatedly performed, the etching rate increases with increases in the time over which the samples were cleaned. This indicates that the increases in the etching rate are due to the removal of residue remaining on the surface of the storage node pattern, i.e., the removal of polymers, or of particles produced by etching damage occurring during dry-etching, or etching residue such as a CF group component. When the APM cleaning was performed beyond 60 minutes, no further increase in the etching rate was observed. Based on this observation, the resultant structure where the primary APM cleaning was performed is then APM-cleaned a second time for about 20–40 minutes (step 140) using the same cleaning solution that was used in the primary APM cleaning process, to thereby etch a layer of material on the surface of the storage node pattern by an amount within a range of about 100–500 Å.

APM cleaning may be performed a third time for about 5–15 minutes (step 150) using the same cleaning solution that was used in the primary APM cleaning. Overall, the APM cleaning may be performed one or more times according to the present invention, until the surface of the storage node pattern is etched about 100–500 Å. However, for growing HSGs in a subsequent process, cleaning the substrate once for a given amount of time is better than cleaning the substrate in two or more stages totaling that same amount of time. This will be described with reference to Table 3.

TABLE 3

Number of Ungrown HSGs for a Cleaning Condition

| APM cleaning conditions | Number of ungrown HSGs |
|---|---|
| Sample #1 APM-cleaned once for 20 minutes | 33 |
| Sample #2 APM-cleaned once for 20 minutes | 34 |
| Sample #3 APM-cleaned once for 20 minutes | 26 |
| Sample #1 APM-cleaned twice for 10 minutes each | 98 |

As shown in Table 3, the number of ungrown HSGs on a sample APM-cleaned once for 20 minutes was nearly three times as small as the number of ungrown HSGs on an identical sample which had been APM-cleaned twice for 10 minutes each. These results indicate that the former technique is advantageous with regard to the growth of HSGs.

Returning to the flowchart of FIG. 3, after the APM cleaning, a native oxide layer remaining on the surface of the storage node pattern is removed by wet-etching using a diluted hydrofluoric acid aqueous solution (step 160). When amorphous silicon is deposited on the surface of the storage node pattern of the capacitor and the resultant structure is annealed, HSGs are formed (step 170).

Figure 4:
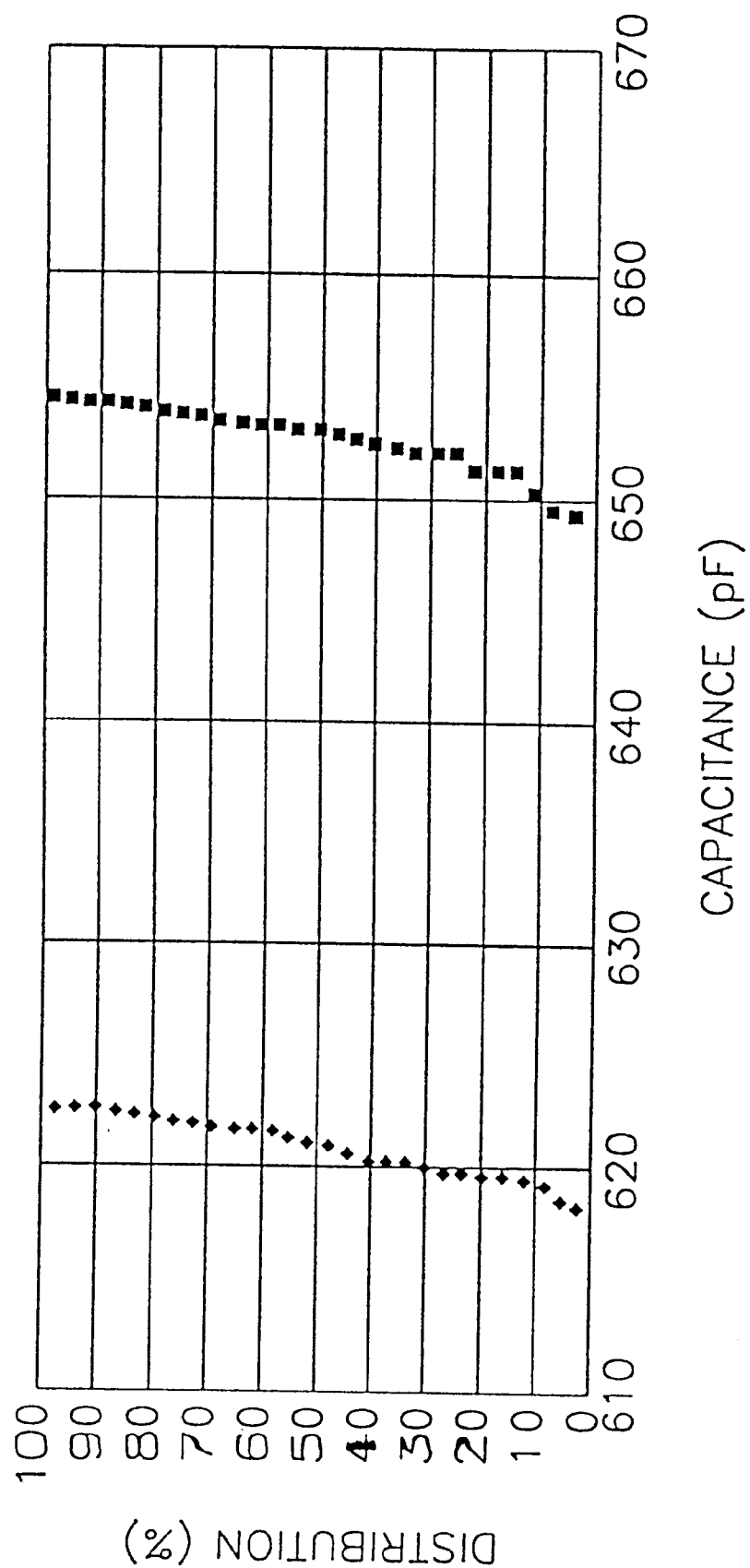
FIG. 4 is a graph illustrating a change in capacitances when ashing is performed during the pre-treatment process according to the present invention compared to the conventional method.

FIG. 4 is a graph illustrating a change in capacitances when ashing is performed during the pre-treatment method according to the present invention. The X-axis indicates a capacitance value pF and the Y-axis indicates distribution (%). The line indicated by diamonds (♦) represents capacitance data measured after performing ashing using only oxygen gas as an etching gas to thus form the capacitor as in the conventional art, and the line indicated by squares (■) represents capacitance data measured after performing ashing in multiple stages using an etching gas containing $CF_4$ to thus form the capacitor as in the present invention. Based on a distribution point of 50%, the capacitance measured when the ashing was performed in the conventional manner was 621 pF and that measured for the manner of the present invention was 653 pF, confirming that a higher capacitance is obtained when the ashing was performed according to the present invention, by fostering the growth of HSGs.

Figure 1:
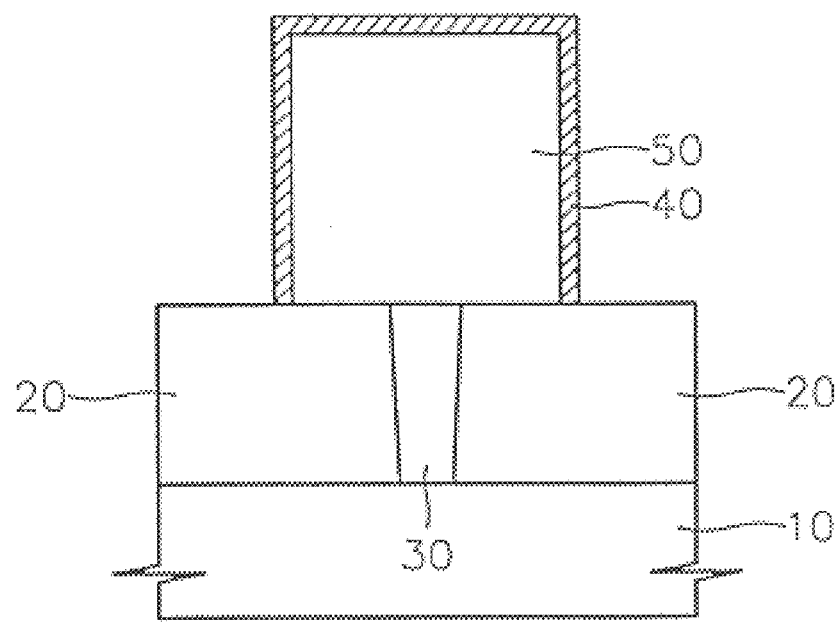
FIG. 1 is a sectional view illustrating a conventional pre-treatment method performed on a semiconductor structure before forming hemi-spherical grains (HSGs) of a capacitor storage node.
Figure 5:
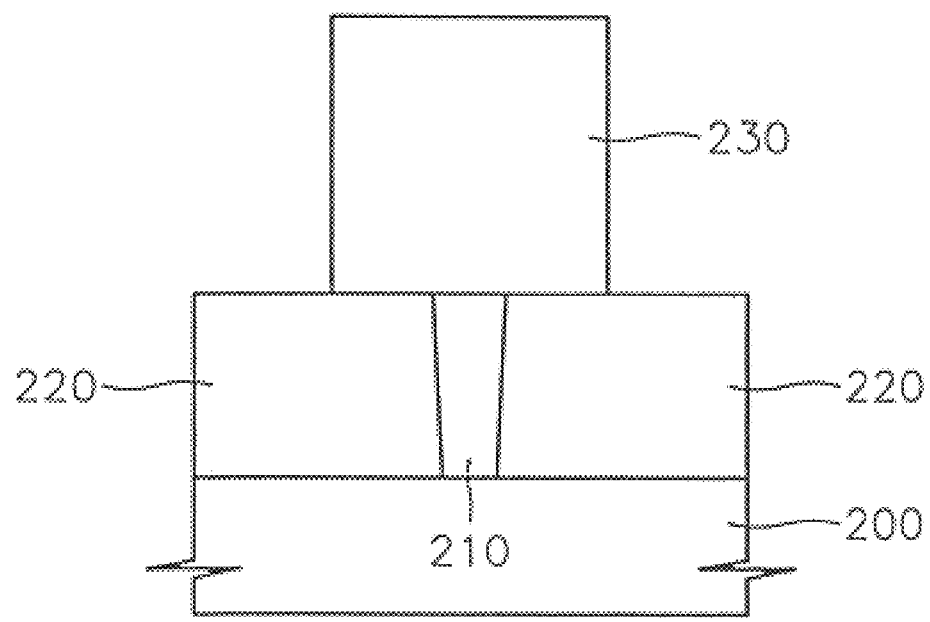
FIG. 5 is a sectional view illustrating a pre-treatment method performed on a semiconductor structure before forming HSGs of a capacitor storage node according to the present invention.

FIG. 5 is a sectional view illustrating a storage node pattern 230 of the capacitor produced after performing the multiple-stage ashing and the APM cleaning according to the present invention. Reference numeral 200 designates a semiconductor substrate, reference numeral 210 designates a plug filling a contact hole, and reference numeral 220 designates an inter-dielectric layer. Recall that when the ashing process was performed in the conventional manner and then the APM cleaning process was performed, it was confirmed that a layer of etching residue 40 (FIG. 1) existing on the capacitor storage node pattern 50 suppressed the growth of HSGs during a subsequent HSG growth process. However, if the multiple ashing sequences and the APM cleaning according to the present invention are performed, the etching residue layer is sufficiently removed, thereby solving the problem of growth of HSGs.

Figure 2:
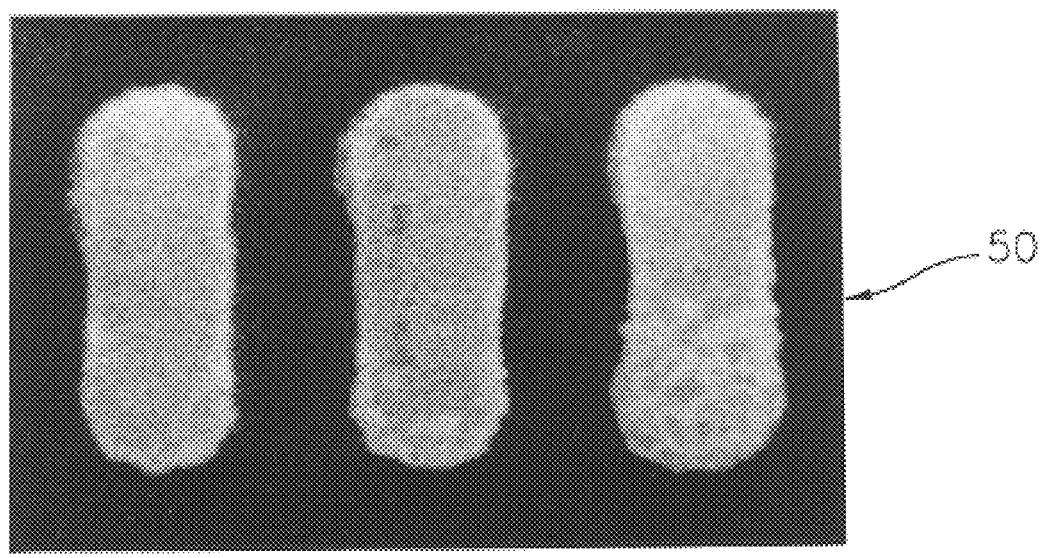
FIG. 2 is a SEM photograph taken when forming HSGs of a capacitor storage node according to a conventional method.
Figure 6:
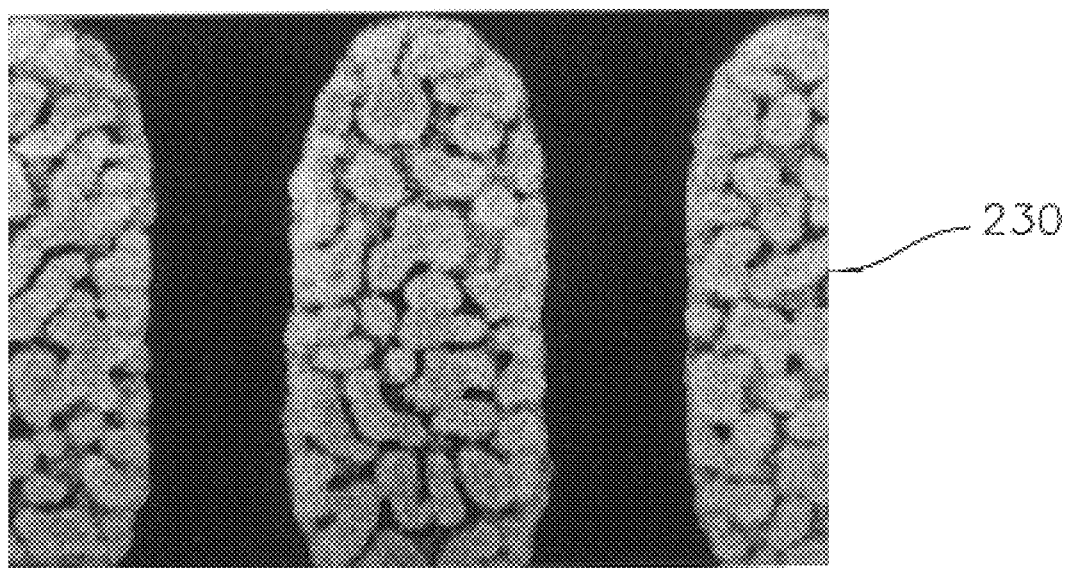
FIG. 6 is a SEM photograph taken when forming HSGs of a capacitor storage node according to the present invention.

FIG. 6 is a SEM photograph of HSGs growing on the surface of a capacitor storage node when APM cleaning according to the present invention was performed for 50 minutes. Note that the number of HSGs shown on the storage node pattern 230 in FIG. 6 is greater than the number of HSGs shown on the storage node pattern 50 in FIG. 2 of the conventional art. The numbers of ungrown HSGs on samples, after the samples had been APM-cleaned according to the present invention for 10–40 minutes, are shown in Table 4.

TABLE 4

Number of Ungrown HSGs for a Cleaning Condition

| APM cleaning conditions | Number of ungrown HSGs |
|---|---|
| Sample APM-cleaned once for 10 minutes | 108 |
| Sample APM-cleaned once for 20 minutes | 72 |
| Sample APM-cleaned once for 30 minutes | 5 |
| Sample AMP-cleaned once for 40 minutes | 2 |
| Sample without APM cleaning | 342 |

As seen from the data in Table 4, the APM cleaning was most effective when performed once for 30–40 minutes. However, as occasion demands, the APM cleaning may be carried out in two or more stages for the same overall time.

Therefore, according to the present invention, the storage node pattern formed of polysilicon is dry-etched, multiple-stage ashing is performed using an etching gas containing $CF_4$, and then APM cleaning is additionally performed before growing HSGs, thereby effectively removing the etching residue generated by the dry-etching process. Accordingly, the growth of the HSGs is fostered and the capacitance of a semiconductor memory device is increased due to the increase in the surface area of the storage node.

Many changes and modifications to the present invention will become apparent to those of ordinary skill in the art. All such changes and modifications are seen to be within the true spirit and scope of the present invention as defined by the appended claims.

What is claimed is:

1. A pre-treatment method performed on a semiconductor structure before growing hemi-spherical grains (HSGs) thereon, the pre-treatment method comprising:
   (a) dry-etching a material layer formed on a surface of a semiconductor substrate, the material layer having a photoresist pattern formed thereon, and wherein the dry-etching forms the semiconductor structure comprising a storage node pattern on the semiconductor substrate;
   (b) performing multiple ashing sequences on the semiconductor structure using an etching gas;
   (c) stripping the semiconductor structure with $H_2SO_4$ to remove any residue remaining on the semiconductor structure after the multiple ashing sequences;
   (d) cleaning the semiconductor structure with an ammonium peroxide mixture (APM); and
   (e) growing the HSGs on storage nodes of the storage node pattern.

2. The pre-treatment method of claim 1, wherein the etching gas in step (b) includes $O_2$ combined with one of $CF_4$ and $N_2$.

3. The pre-treatment method of claim 1, wherein the multiple ashing sequences are performed in batch wafer ashing equipment.

4. The pre-treatment method of claim 1, wherein the multiple ashing sequences of step (b) are three sequences.

5. The pre-treatment method of claim 4, wherein the multiple ashing sequences of step (b) comprise:
   (b1) removing polymers at sidewalls of the dry-etched storage node pattern;
   (b2) removing the photoresist pattern; and
   (b3) removing a native oxide layer and a layer produced by etching damage on a surface of the storage nodes.

6. The pre-treatment method of claim 5, wherein during the ashing sequence of step (b1), the etching gas comprises $O_2$ and $CF_4$ mixed in a ratio of about 100 to 2.5.

7. The pre-treatment method of claim 6, wherein the ashing sequence of step (b1) is performed for about 20–40 seconds at a chamber pressure of 0.8–1.2 Torr, a temperature of 240–260° C. and a power of 920–980 W.

8. The pre-treatment method of claim 5, wherein during the ashing sequence of step (b2), the etching gas comprises $O_2$ and $N_2$ mixed in a ratio of about 100 to 5.

9. The pre-treatment method of claim 8, wherein the ashing sequence of step (b2) is performed for about 30–50 seconds at a chamber pressure of 0.9–1.3 Torr, a temperature of 240–260° C. and a power of 870–930 W.

10. The pre-treatment method of claim 5, wherein during the ashing sequence of step (b3), the etching gas comprises $O_2$ and $CF_4$ mixed in a ratio of about 100 to 1.5.

11. The pre-treatment method of claim 10, wherein the ashing sequence of step (b3) is performed for about 10–30 seconds at a chamber pressure of 0.9–1.3 Torr, a temperature of 240–260° C. and a power of 870–930 W.

12. The pre-treatment method of claim 1, wherein the cleaning of step (d) comprises cleaning the semiconductor structure with a solution selected from a group consisting of $NH_4OH+H_2O_2$+deionized water, $NH_4OH+H_2O_2$, $NH_4F$+$HF+H_2O_2$+deionized water, $CH_3COOH+HNO_3+HF$+deionized water, and $NH_4OH$+deionized water.

13. The pre-treatment method of claim 1, wherein the cleaning of step (d) is performed in multiple steps.

14. The pre-treatment method of claim 1, wherein the cleaning of step (d) is performed for a time period sufficient to etch and remove about 100 Å–500 Å of material from a surface of the storage node pattern.

15. The pre-treatment method of claim 1, wherein the cleaning of step (d) is performed for about 20–40 minutes.

16. The pre-treatment method of claim 1, wherein after the cleaning of step (d), further comprising a step of removing a native oxide layer from a surface of the storage node pattern.

17. The pre-treatment method of claim 16, wherein after the cleaning of step (d), further comprising an additional step of cleaning the semiconductor substrate with an ammonium peroxide mixture (APM) for a time period, before removing the native oxide layer.

18. The pre-treatment method of claim 17, wherein the additional step of cleaning the semiconductor substrate is performed for about 5–15 minutes.

* * * * *